United States Patent
Wang et al.

(10) Patent No.: US 9,319,041 B1
(45) Date of Patent: Apr. 19, 2016

(54) SQUELCH DETECTOR

(71) Applicants: GLOBAL UNICHIP CORPORATION, Hsinchu (TW); TAIWAN SEMICONDUCTOR MANUFACTURING CO., LTD, Hsin-Chu (TW)

(72) Inventors: Ju-Chieh Wang, Hsinchu (TW); Ting-Hsu Chien, Hsinchu (TW); Da-Rong Huang, Hsinchu (TW)

(73) Assignees: GLOBAL UNICHIP CORPORATION, Hsinchu (TW); TAIWAN SEMICONDUCTOR MANUFACTURING CO., Hsin-Chu (TW)

( * ) Notice: Subject to any disclaimer, the term of this patent is extended or adjusted under 35 U.S.C. 154(b) by 0 days.

(21) Appl. No.: 14/681,173

(22) Filed: Apr. 8, 2015

(51) Int. Cl.
*H03K 5/153* (2006.01)
*H03K 5/24* (2006.01)

(52) U.S. Cl.
CPC .................. *H03K 5/2481* (2013.01)

(58) Field of Classification Search
CPC .. G01R 19/04; G01R 19/0038; H03K 5/1532; H03K 5/082; H03K 5/2481; H03K 5/249; H03K 5/2418; G11B 20/10009; H04L 25/0272; H03F 3/45183
USPC ................................. 327/65, 66, 58
See application file for complete search history.

(56) References Cited

U.S. PATENT DOCUMENTS

| | | | |
|---|---|---|---|
| 7,471,118 B2 | 12/2008 | Liu | |
| 7,653,367 B2 | 1/2010 | Song et al. | |
| 8,497,711 B2* | 7/2013 | Hsieh | 327/58 |
| 2002/0109532 A1* | 8/2002 | Nakada | 327/74 |
| 2007/0023849 A1 | 2/2007 | Yu et al. | |
| 2012/0015617 A1* | 1/2012 | Srivastava et al. | 455/218 |

* cited by examiner

*Primary Examiner* — Quan Tra
(74) *Attorney, Agent, or Firm* — WPAT, P.C.; Justin King (57) ABSTRACT

A squelch detector receives a first input signal, a second input signal VM, a first reference voltage and a second reference voltage. The first input signal and the second input signal are collaboratively defined as a differential input signal. The difference between the first reference voltage and the second reference voltage is defined as a squelch threshold. According to the squelch threshold, the squelch detector generates a detected signal to indicate whether the differential input signal is valid.

11 Claims, 8 Drawing Sheets

SQUELCH DETECTOR

FIELD OF THE INVENTION

The present invention relates to a detector, and more particularly to a squelch detector.

BACKGROUND OF THE INVENTION

Generally, USB devices, PCIe devices, mobile industry processor interface (MIPI) devices transmit data according to differential signals. In addition, these devices are usually equipped with squelch detectors to detect whether the differential signals are valid.

Figure 1A:
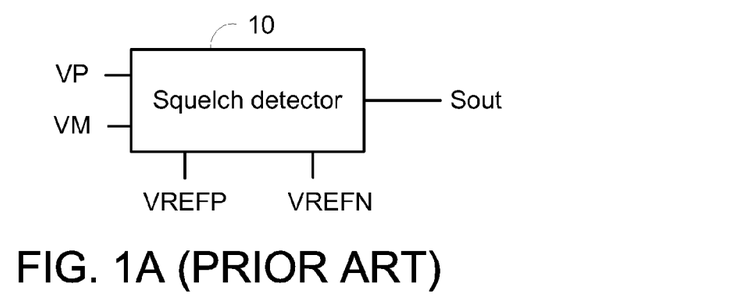
FIG. 1A (prior art) schematically illustrates the relationships between associated signals and a squelch detector.
Figure 1B:
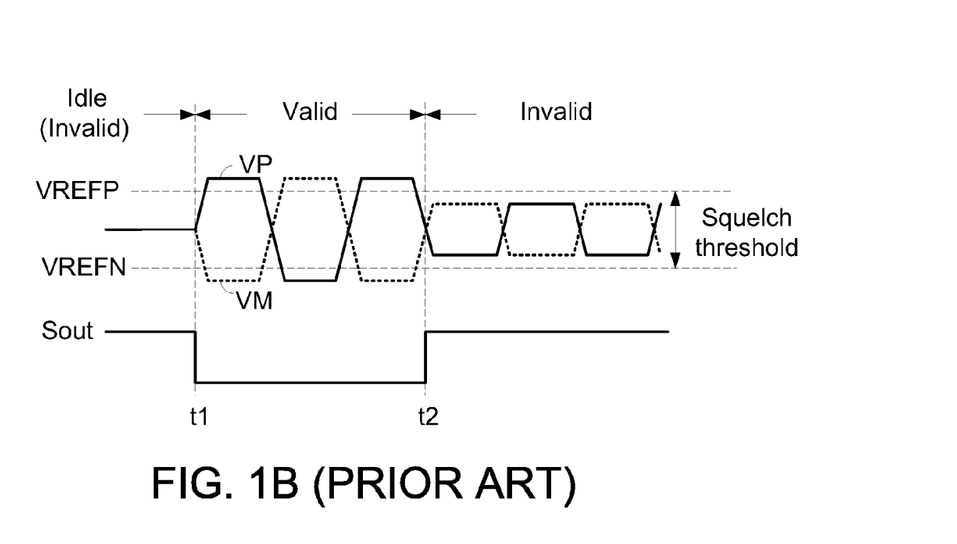
FIG. 1B (prior art) is a schematic timing waveform diagram illustrating associated signals processed by the squelch detector.

FIG. 1A schematically illustrates the relationships between associated signals and a squelch detector. FIG. 1B is a schematic timing waveform diagram illustrating associated signals processed by the squelch detector. The squelch detector 10 receives a first input signal VP and a second input signal VM. The first input signal VP and the second input signal VM are collaboratively defined as a differential input signal. Moreover, the squelch detector 10 receives a first reference voltage VREFP and a second reference voltage VREFN, wherein the first reference voltage VREFP is higher than the second reference voltage VREFN. Moreover, the difference between the first reference voltage VREFP and the second reference voltage VREFN is defined as a squelch threshold.

Generally, the squelch detector 10 judges the differential input signal according to the squelch threshold, and generating a detected signal Sout according to the judging result. The detected signal Sout indicates whether the differential input signal is valid or not.

Please refer to FIG. 1B. Before the time point t1, the differential input signal is in an idle state. Consequently, the differential input signal is maintained at the same voltage. The magnitude of this voltage is in the range between the first reference voltage VREFP and the second reference voltage VREFN. Under this circumstance, the detected signal Sout is in a first logic-level state (e.g. a high logic-level state). The detected signal Sout in the first logic-level state represents the invalid differential input signal. The invalid differential input signal is also referred as a squelched signal.

In the time interval between the time point t1 and the time point t2, the maximum values of the first input signal VP and the second input signal VM are higher than the first reference voltage VREFP, and the minimum values of the first input signal VP and the second input signal VM are lower than the second reference voltage VREFN. Under this circumstance, the detected signal Sout is in a second logic-level state (e.g. a low logic-level state). The detected signal Sout in the second logic-level state represents the valid differential input signal. The valid differential input signal is also referred as a not-squelched signal.

After the time point t2, the maximum values of the first input signal VP and the second input signal VM are lower than the first reference voltage VREFP, and the minimum values of the first input signal VP and the second input signal VM are higher than the second reference voltage VREFN. Under this circumstance, the detected signal Sout is in the first logic-level state (e.g. the high logic-level state). The detected signal Sout in the first logic-level state represents the invalid differential input signal or the squelched signal.

Generally, if the detected signal Sout represents the invalid differential input signal, it means that the first input signal VP and the second input signal VM are bad signals or noise.

Figure 2:
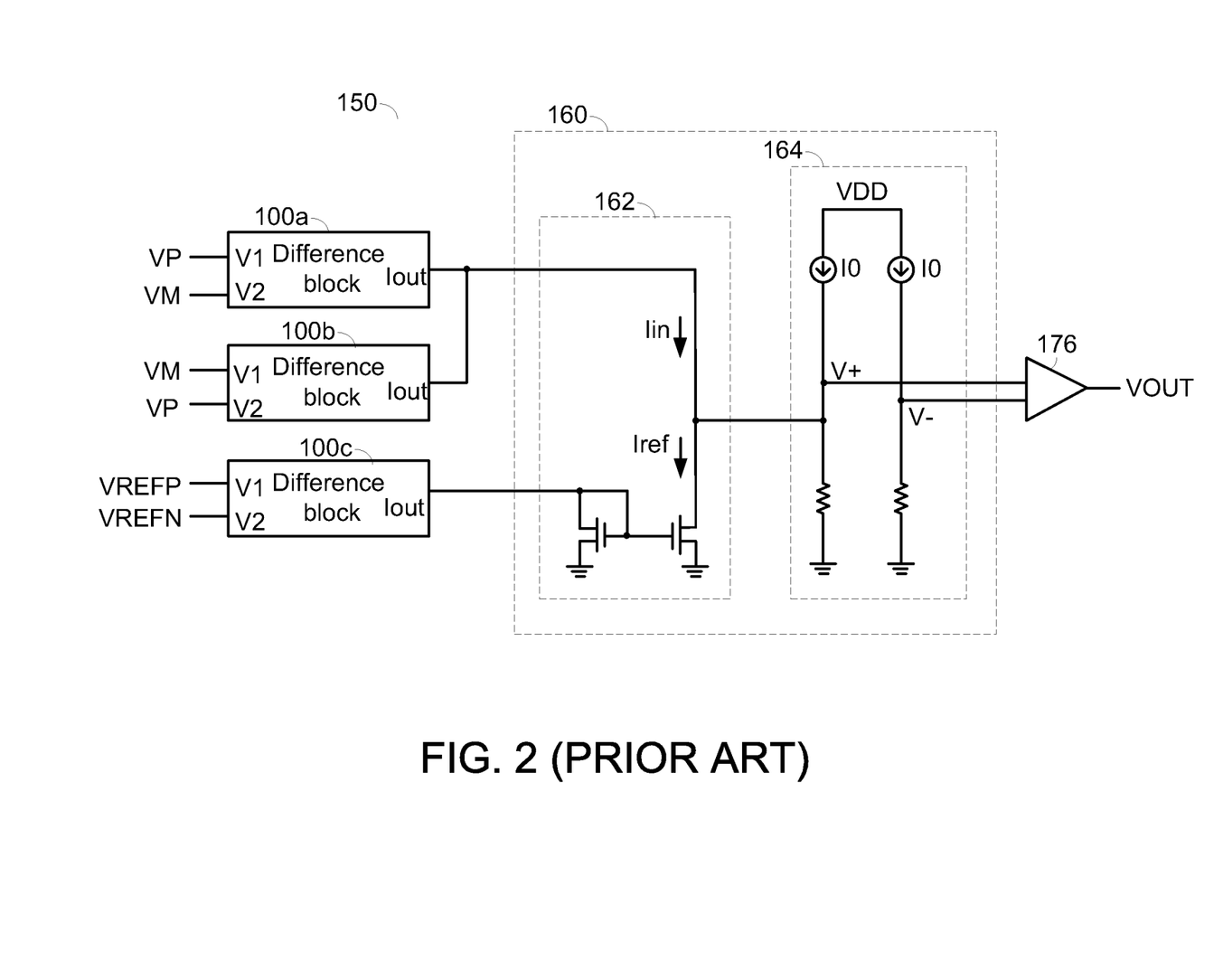
FIG. 2 (prior art) schematically illustrates the architecture of a conventional squelch detection system for high speed data links.

FIG. 2 schematically illustrates the architecture of a conventional squelch detection system for high speed data links. This squelch detection system is disclosed in U.S. Pat. No. 7,471,118 for example. As shown in FIG. 2, the squelch detection system 100 comprises plural difference blocks 100a~100c, a difference circuit 160, and a comparing circuit 176.

After a first reference voltage VREFP and a second reference voltage VREFN are received by the difference block 100c, a reference current Iref is outputted from a current output terminal Iout. The current output terminals Iout of the difference blocks 100a and 100b are connected with each other to output an input current Iin.

Moreover, the difference circuit 160 comprises a first part 162 and a second part 164. According to the relationship between the input current Iin and the reference current Iref, a V+ voltage of the second part 164 is correspondingly changed by the first part 162. For example, if the input current Iin is lower than the reference current Iref, the V+ voltage decreases and the V+ voltage is lower than the V− voltage. Whereas, if the input current Iin is higher than the reference current Iref, the V+ voltage increases and the V+ voltage is higher than the V− voltage.

For example, if the maximum values of the first input signal VP and the second input signal VM are lower than the first reference voltage VREFP and the minimum values of the first input signal VP and the second input signal VM are higher than the second reference voltage VREFN, the input current Iin is lower than the reference current Iref. Consequently, the V+ voltage is lower than the V− voltage. Under this circumstance, a detected signal VOUT issued from the comparing circuit 176 is in a first logic-level state (e.g. a high logic-level state). The detected signal VOUT in the first logic-level state represents the invalid differential input signal.

On the other hand, if the maximum values of the first input signal VP and the second input signal VM are higher than the first reference voltage VREFP and the minimum values of the first input signal VP and the second input signal VM are lower than the second reference voltage VREFN, the input current Iin is higher than the reference current Iref. Consequently, the V+ voltage increases and the V+ voltage is higher than the V− voltage. Under this circumstance, a detected signal VOUT issued from the comparing circuit 176 is in a second logic-level state (e.g. a low logic-level state). The detected signal VOUT in the second logic-level state represents the valid differential input signal.

Figure 3A:
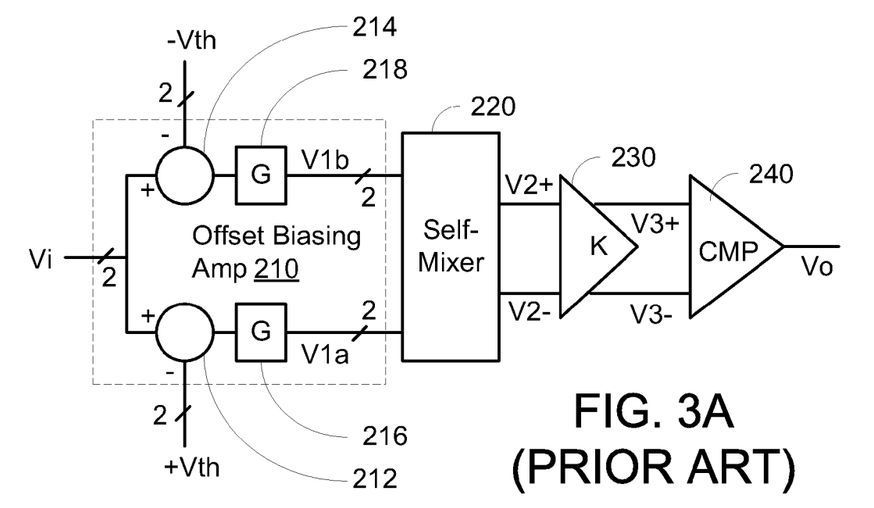
FIG. 3A to FIG. 3C (prior art) schematically illustrate the architecture of another conventional squelch detector.
Figure 3B:
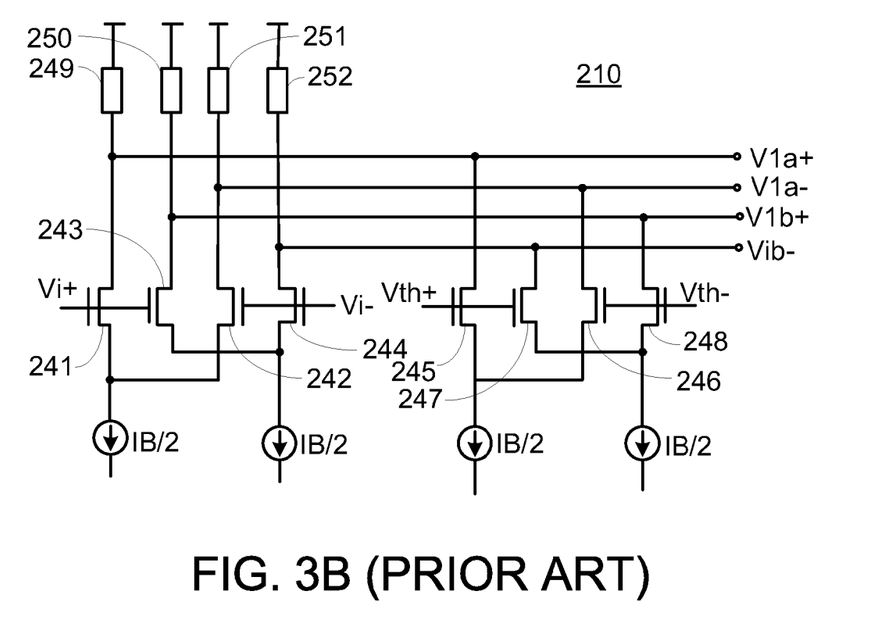
Figure 3C:
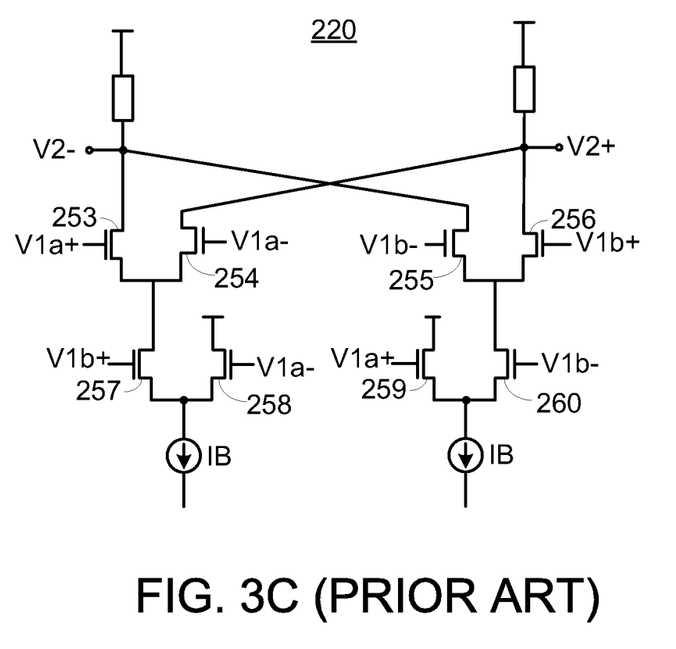

FIG. 3A to FIG. 3C schematically illustrate the architecture of another conventional squelch detector. This squelch detector is disclosed in US Publication No. 2007/023849. As shown in FIG. 3A, the squelch detector 200 includes a differential offset biasing amplifier 210, a differential self-mixer 220 coupled to the differential offset biasing amplifier 210, a differential comparator 240, and a differential gain stage 230 coupled between the differential self-mixer 220 and the differential comparator 240.

The differential offset biasing amplifier 210 receives a differential input signal Vi=(Vi+−Vi−) at a first set of differential input terminals and a differential squelch detection threshold signal Vth=(Vth+−Vth−) at a second set of differential input terminals. The differential offset biasing amplifier 210 includes a first differential circuit 212 and a second differential circuit 214. In operation, the first differential circuit 212 subtracts the differential squelch detection threshold signal (Vth+−Vth−) from the differential input signal (Vi+−Vi−) to generate a first differential offset biased signal (V1a). The second differential circuit 214 adds the differential squelch detection threshold signal (Vth+−Vth−) to the differential input signal (Vi+−Vi−) to generate a second differential offset biased signal (V1b). Each differential circuit 212, 214 may also provide gain G as an integral function or the gain may be provided by a separate gain circuit 216, 218. Thereafter, the differential offset biased signals (V1a, V1b), are output by the differential offset biasing amplifier 210.

The differential self-mixer 220 receives the differential offset biased signals (V1a, V1b) at its input terminals. The differential self-mixer 220 is fully differential and selectively passes and mixes the detected positive and negative peaks from the differential offset biased signals and down converts the signal directly to a differential direct current signal (V2). Thereafter, the differential direct current signal (V2) is output by the differential self-mixer 220.

The differential gain stage 230 in this example is utilized to further amplify the differential direct current signal (V2) output by the differential self-mixer 220, when increased signal amplitude is desired by the application. The differential gain stage 230 amplifies the differential direct current signal (V2) by the gain K. Thereafter, the amplified differential direct current signal (V3) is output by the differential gain stage 230.

The differential comparator 240 receives the amplified differential direct current signal (V3) at its differential input. The differential comparator 240 converts the amplified differential direct current signal (V3) to a digital squelch signal (Vo). For example, when the potential of the amplified differential direct current signal (V3) is greater than zero, the differential comparator outputs a squelch signal (Vo) having a first logic level. When the potential of the differential direct current signal (V3) is substantially zero, the differential comparator outputs a squelch signal (Vo) having a second logic level. Thereafter, the squelch signal (Vo) is output by the differential comparator 240.

FIG. 3B shows an exemplary implementation of the differential offset biasing amplifier 210 of FIG. 3A. The differential offset biasing amplifier 210 includes a first transistor 241 and a second transistor 242 that are coupled to form a first differential pair. Likewise, the differential offset biasing amplifier 210 includes a third transistor 243 and fourth transistor 244 coupled to form a second differential pair. Further, the differential offset biasing amplifier 210 also includes a fifth transistor 245 and sixth transistor 246 coupled to form a third differential pair, and a seventh transistor 247 and eighth transistor 248 coupled to form a fourth differential pair.

Furthermore, the loads 249, 250, 251, 252 of the differential pairs may be resistive elements, inductive elements, transistors configured as active loads, or the like.

In operation, the first differential pair 241, 242 receives the differential input signal (Vi+-Vi-) at its input terminals and the third differential pair 245, 246 receives the differential squelch detection threshold signal (Vth+-Vth-) at its input terminals. The outputs of the first differential pair 241, 242 and third differential pair 245, 246 are coupled together such that the differential squelch detection threshold signal (Vth+-Vth-) is subtracted from the differential input signals (Vi+-Vi-). Similarly, the second differential pair 243, 244 receives the differential input signal (Vi+-Vi-) at its input terminals and the fourth differential pair 247, 248 receives the differential squelch detection threshold signal (Vth+-Vth-) at its input terminals. The outputs of the second differential pair 243, 244 and fourth differential pair 247, 248 are coupled together such that the differential squelch detection threshold signal (Vth+-Vth-) is added to the differential input signals (Vi+-Vi-).

Thus, the coupled first differential pair 241, 242 and third differential pair 245, 246 provide positive peak detection by subtracting the differential squelch detection threshold signal (Vth+-Vth-) from the differential input signal (Vi+-Vi-). The coupled second differential pair 243, 244 and fourth differential pair 247, 248 provide negative peak detection by adding the differential squelch detection threshold signal (Vth+-Vth-) to the differential input signal (Vi+-Vi-).

FIG. 3C shows an exemplary implementation of the differential self-mixer 220 of FIG. 3A. The differential self-mixer 220 includes first and second transistors 253, 254 coupled to form a first differential pair, and third and fourth transistors 255, 256 coupled to form a second differential pair. The differential self-mixer 220 also includes fifth and sixth transistors 257, 258 coupled to form a third differential pair, and seventh and eighth transistors 259, 260 coupled to form a fourth differential pair.

The first differential pair 253, 254 receives the first differential offset biased signal (V1a+, V1a-) and the second differential pair 255, 256 receives the second offset biased differential signal (V1b+, V1b-). The third differential pair 257, 258 is coupled in series with the first differential pair 253, 254. The fourth differential pair 259, 260 is coupled in series with the second differential pair 255, 256. The outputs of the first differential pair 253, 254 and second differential pair 255, 256 are coupled together such that the positive and negative peaks from the differential offset biased signals (V1a, V1b), that correspond to when the potential difference of the input signal (Vi) exceeds the potential difference of the squelch detection threshold signal (Vth), are selectively passed, mixed and down converted directly to a direct current signal (V2).

In particular, the third differential pair 257, 258 selectively provides the bias current IB to the first differential pair 253, 254 when the first side of the second differential offset biased signal (V1b+) is greater than the second side of the first differential offset biased signal (V1a-). Thus, the relatively small peaks of V1a 310 are selectively passed to the output during the relatively large peaks of V1b 330. Similarly, the fourth differential pair 259, 260 selectively provides the bias current IB to the second differential pair 255, 256 when the second side of the second differential offset biased signal (V1b-) is greater than the first side of the first differential offset biases signal (V1a+). Likewise, the relatively small peaks 320 of V1b are selectively passed to the output during the relatively large peaks 340 of V1a.

The differential self-mixer 220 advantageously improves the dynamic range of the squelch detection signal, as compared to conventional squelch detectors. The direct conversion of the detected peaks to direct current also allows implementation of high gain amplifying using a single gain stage with low bias current in the differential gain stage 230, resulting in a reduction in power consumption and layout area in devices. signal VM are higher than the first reference voltage VREFP and the minimum values of the first input signal VP and the second input signal VM are lower than the second reference voltage VREFN, the input current Iin is higher than the reference current Iref. Consequently, the V+ voltage increases and the V+ voltage is higher than the V- voltage. Under this circumstance, a detected signal VOUT issued from the comparing circuit 176 is in a second logic-level state (e.g. a low logic-level state). The detected signal VOUT in the second logic-level state represents the valid differential input signal.

SUMMARY OF THE INVENTION

The present invention provides a novel squelch detector capable of distinguishing the valid differential input signal from the invalid differential input signal.

An embodiment of the present invention provides a squelch detector. The squelch detector includes a first differential pair circuit, a second differential pair circuit, a reference differential pair circuit, a first current mirror, a second current mirror, a second current-to-voltage converter, a second current-to-voltage converter, and a judging circuit. The first differential pair circuit receives a first input signal and a second input signal, and generates a first current and a second current to a first node and a second node, respectively. The second differential pair circuit receives the first input signal and the second input signal, and generates a third current and a fourth current to a third node and a fourth node, respectively. The reference differential pair circuit receives a first reference voltage and a second reference voltage, and generates a first reference current and a second reference current to a fifth node and a sixth node, respectively. A current input terminal of the first current mirror is connected with the fifth node for receiving the first reference current, a first current mirroring terminal of the first current mirror is connected with the first node, and a second current mirroring terminal of the first current mirror is connected with the fourth node. The current input terminal of the second current mirror is connected with the sixth node for receiving the second reference current, a first current mirroring terminal of the second current mirror is connected with the second node, and a second current mirroring terminal of the second current mirror is connected with the third node. The first current-to-voltage converter is connected with the first node and the second node, and generates a first output signal and a second output signal according to a current change of the first node and the second node. The second current-to-voltage converter is connected with the third node and the fourth node, and generates a third output signal and a fourth output signal according to a current change of the third node and the third node. The judging circuit receives the first output signal, the second output signal, the third output signal and the fourth output signal, and generates a detected signal to indicate whether the first input signal and the second input signal are valid.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 4A:
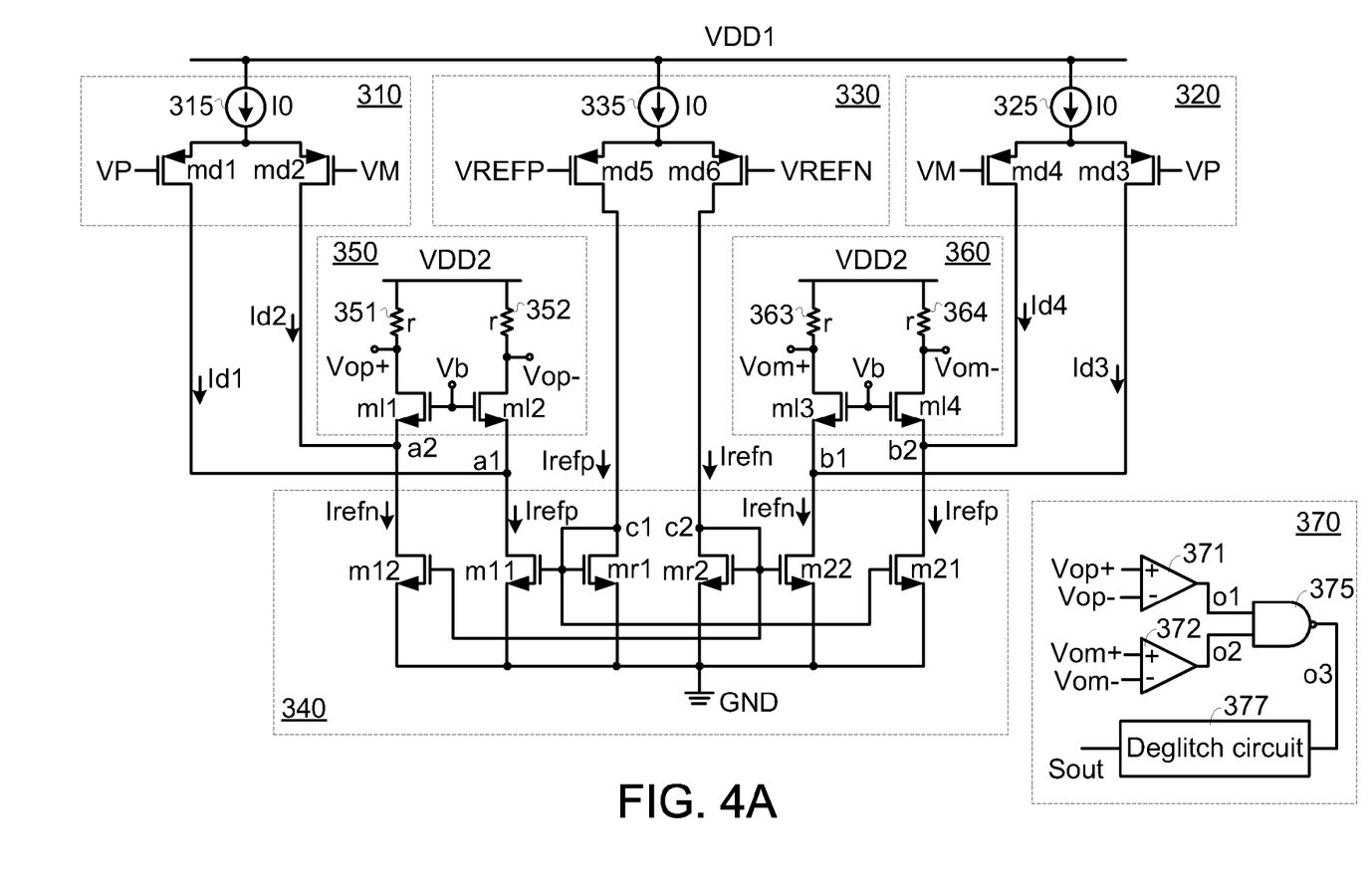
FIG. 4A schematically illustrates the architecture of a squelch detector according to a first embodiment of the present invention.

FIG. 4A schematically illustrates the architecture of a squelch detector according to a first embodiment of the present invention. As shown in FIG. 4A, the squelch detector comprises a first differential pair circuit 310, a second differential pair circuit 320, a reference differential pair circuit 330, a mirroring circuit 340, a first current-to-voltage converter 350, a second current-to-voltage converter 360, and a judging circuit 370.

In this embodiment, the squelch detector receives a first input signal VP, a second input signal VM, a first reference voltage VREFP and a second reference voltage VREFN. The first input signal VP and the second input signal VM are collaboratively defined as a differential input signal. Moreover, the squelch detector generates a detected signal Sout to indicate whether the differential input signal is valid or not. The first reference voltage VREFP is higher than the second reference voltage VREFN. Moreover, the difference between the first reference voltage VREFP and the second reference voltage VREFN is defined as a squelch threshold.

The first differential pair circuit 310 comprises a first current source 315, and two transistors md1 and md2. A first end of the first current source 315 is connected with a first voltage source VDD1. The source terminal of the transistor md1 is connected with a second end of the first current source 315. The drain terminal of the transistor md1 is connected with a node a1. The gate terminal of the transistor md1 receives the first input signal VP. The source terminal of the transistor md2 is connected with the second end of the first current source 315. The drain terminal of the transistor md2 is connected with a node a2. The gate terminal of the transistor md2 receives the second input signal VM. The first current source 315 may generate a constant current I0. According to the first input signal VP and the second input signal VM, the first differential pair circuit 310 generates a first current Id1 and a second current Id2 from the drain terminal of the transistor md1 and the drain terminal of the transistor md2, respectively.

The second differential pair circuit 320 comprises a second current source 325, and two transistors md3 and md4. A first end of the second current source 325 is connected with the first voltage source VDD1. The source terminal of the transistor md3 is connected with a second end of the second current source 325. The drain terminal of the transistor md3 is connected with a node b1. The gate terminal of the transistor md3 receives the first input signal VP. The source terminal of the transistor md4 is connected with the second end of the second current source 325. The drain terminal of the transistor md4 is connected with a node b2. The gate terminal of the transistor md4 receives the second input signal VM. The second current source 325 may generate the constant current I0. According to the first input signal VP and the second input signal VM, the second differential pair circuit 320 generates a third current Id3 and a fourth current Id4 from the drain terminal of the transistor md3 and the drain terminal of the transistor md4, respectively.

The reference differential pair circuit 330 comprises a third current source 335, and two transistors md5 and md6. A first end of the third current source 335 is connected with the first voltage source VDD1. The source terminal of the transistor md5 is connected with a second end of the third current source 335. The drain terminal of the transistor md5 is connected with a node c1. The gate terminal of the transistor md5 receives the first reference voltage VREFP. The source terminal of the transistor md6 is connected with the second end of the third current source 335. The drain terminal of the transistor md6 is connected with a node c2. The gate terminal of the transistor md6 receives the second reference voltage VREFN. The third current source 335 may generate the constant current I0. According to the first reference voltage VREFP and the second reference voltage VREFN, the reference differential pair circuit 330 generates a first reference current Irefp and a second reference current Irefn from the drain terminal of the transistor md5 and the drain terminal of the transistor md6, respectively.

The mirroring circuit 340 comprises two current mirrors. The first current mirror comprises three transistors mr1, m11 and m21. The drain terminal and the gate terminal of the transistor mr1 are connected with the node c1. The source terminal of the transistor mr1 is connected with a ground voltage source GND. The gate terminal of the transistor m11 is connected with the node c1. The drain terminal of the transistor m11 is connected with the node a1. The source terminal of the transistor m11 is connected with the ground voltage source GND. The gate terminal of the transistor m21 is connected with the node c1. The drain terminal of the transistor m21 is connected with the node b2. The source terminal of the transistor m21 is connected with the ground voltage source GND. Moreover, the drain terminal of the transistor mr1 is a current input terminal of the first current mirror, the drain terminal of the transistor m11 is a first current mirroring terminal of the first current mirror, and the drain terminal of the transistor m21 is a second current mirroring terminal of the first current mirror. In other word, the first reference current Irefp is received by the current input terminal of the first current mirror, and the first reference current Irefp is outputted from the two current mirroring terminals of the first current mirror.

The second current mirror comprises three transistors mr2, m12 and m22. The drain terminal and the gate terminal of the transistor mr2 are connected with the node c2. The source terminal of the transistor mr2 is connected with the ground voltage source GND. The gate terminal of the transistor m12 is connected with the node c2. The drain terminal of the transistor m12 is connected with the node a2. The source terminal of the transistor m12 is connected with the ground voltage source GND. The gate terminal of the transistor m22 is connected with the node c2. The drain terminal of the transistor m22 is connected with the node b1. The source terminal of the transistor m22 is connected with the ground voltage source GND. Moreover, the drain terminal of the transistor mr2 is a current input terminal of the second current mirror, the drain terminal of the transistor m12 is a first current mirroring terminal of the second current mirror, and the drain terminal of the transistor m22 is a second current mirroring terminal of the second current mirror. In other word, the second reference current Irefn is received by the current input terminal of the second current mirror, and the second reference current Irefn is outputted from the two current mirroring terminals of the second current mirror.

The first current-to-voltage converter 350 is connected with the node a1 and the node a2. According to the current changes of the node a1 and the node a2, the first current-to-voltage converter 350 generates a first output signal Vop+ and a second output signal Vop−. The first current-to-voltage converter 350 comprises a first resistor 351, a second resistor 352, and two transistors ml1 and ml2. A first end of the first resistor 351 is connected with a second voltage source VDD2. The first output signal Vop+ is outputted from a second end of the first resistor 351. A first end of the second resistor 352 is connected with the second voltage source VDD2. The second output signal Vop− is outputted from a second end of the second resistor 352. The drain terminal of the transistor ml1 is connected with the second end of the first resistor 351. The source terminal of the transistor ml1 is connected with the node a2. The gate terminal of the transistor ml1 receives a bias voltage Vb. The drain terminal of the transistor ml2 is connected with the second end of the second resistor 352. The source terminal of the transistor ml2 is connected with the node a1. The gate terminal of the transistor ml2 receives the bias voltage Vb. By subtracting the second output signal Vop− from the first output signal Vop+, a first differential output signal Vop is generated. That is, (Vop+)−(Vop−)=Vop. In this embodiment, the first resistor 351 and the second resistor 352 have the same resistance value r. Moreover, the first voltage source VDD1 and the second voltage source VDD2 may be different voltage sources, or the first voltage source VDD1 and the second voltage source VDD2 may be the same voltage source.

The second current-to-voltage converter 360 is connected with the node b1 and the node b2. According to the current changes of the node b1 and the node b2, the second current-to-voltage converter 360 generates a third output signal Vom+ and a fourth output signal Vom−. The second current-to-voltage converter 360 comprises a third resistor 363, a fourth resistor 364, and two transistors ml3 and ml4. A first end of the third resistor 363 is connected with the second voltage source VDD2. The third output signal Vom+ is outputted from a second end of the third resistor 363. A first end of the fourth resistor 364 is connected with the second voltage source VDD2. The fourth output signal Vom− is outputted from a second end of the fourth resistor 364. The drain terminal of the transistor ml3 is connected with the second end of the third resistor 363. The source terminal of the transistor ml3 is connected with the node b1. The gate terminal of the transistor ml3 receives the bias voltage Vb. The drain terminal of the transistor ml4 is connected with the second end of the fourth resistor 364. The source terminal of the transistor ml4 is connected with the node b2. The gate terminal of the transistor ml4 receives the bias voltage Vb. By subtracting the fourth output signal Vom− from the third output signal Vom+, a second differential output signal Vom is generated. That is, (Vom+)−(Vom−)=Vom. In this embodiment, the third resistor 363 and the fourth resistor 364 have the same resistance value r.

Moreover, the judging circuit 370 receives the first output signal Vop+, the second output signal Vop−, the third output signal Vom+ and the fourth output signal Vom−, and generates a detected signal Sout according to the detecting result. The detected signal Sout indicates whether the differential input signal is valid or not. In this embodiment, the judging circuit 370 comprises a first comparator 371, a second comparator 372, an NAND gate 375, and a deglitch circuit 377. The first comparator 371 comprises a positive input terminal receiving the first output signal Vop+ and a negative input terminal receiving the second output signal Vop−. The second comparator 372 comprises a positive input terminal receiving the third output signal Vom+ and a negative input terminal receiving the fourth output signal Vom−. The two input terminals of the NAND gate 375 are connected with the output terminal o1 of the first comparator 371 and the output terminal o2 of the second comparator 372. The deglitch circuit 377 is connected with the output terminal of o3 the NAND gate 375. In addition, the detected signal Sout is outputted from the deglitch circuit 377.

In accordance with a feature of the present invention, if the first differential output signal Vop and the second differential output signal Vom have the same polarity, the detected signal Sout is in a first logic-level state (e.g. a low logic-level state). The detected signal Sout in the first logic-level state represents the invalid differential input signal. Whereas, if the first differential output signal Vop and the second differential output signal Vom have opposite polarities, the detected signal Sout is in a second logic-level state (e.g. a high logic-level state). The detected signal Sout in the second logic-level state represents the valid differential input signal. The reasons will be illustrated in more details as follows.

Since the first reference voltage VREFP is higher than the second reference voltage VREFN, the first reference current Irefp is higher than the second reference current Irefn.

If the maximum values of the first input signal VP and the second input signal VM are lower than the first reference voltage VREFP and the minimum values of the first input signal VP and the second input signal VM are higher than the second reference voltage VREFN, both of the first current Id1 and third current Id3 are lower than the first reference current Irefp and both of the second current Id2 and the fourth current Id4 are higher than the second reference current Irefn. Consequently, in the first current-to-voltage converter 350, the first output signal Vop+ is higher than the second output signal Vop−. Moreover, in the second current-to-voltage converter 360, the third output signal Vom+ is higher than the fourth output signal Vom−. Under this circumstance, the signal outputted from the output terminal o1 of the first comparator 371 and the signal outputted from the output terminal o2 of the second comparator 372 are both in the high logic-level state. Consequently, the detected signal Sout outputted from the judging circuit 370 is in the low logic-level state, representing the invalid differential input signal.

On the other hand, if the maximum value of the first input signal VP is higher than the first reference voltage VREFP and the minimum value of the second input signal VM is lower than the second reference voltage VREFN, both of the first current Id1 and third current Id3 are higher than the first reference current Irefp and both of the second current Id2 and the fourth current Id4 are lower than the second reference current Irefn. Consequently, in the first current-to-voltage converter 350, the first output signal Vop+ is lower than the second output signal Vop−. Moreover, in the second current-to-voltage converter 360, the third output signal Vom+ is higher than the fourth output signal Vom−. Under this circumstance, the signal outputted from the output terminal o1 of the first comparator 371 is in the low logic-level state, and the signal outputted from the output terminal o2 of the second comparator 372 is in the high logic-level state. Consequently, the detected signal Sout outputted from the judging circuit 370 is in the high logic-level state, representing the valid differential input signal.

On the other hand, if the maximum value of the second input signal VM is higher than the first reference voltage VREFP and the minimum value of the first input signal VP is lower than the second reference voltage VREFN, both of the second current Id2 and the fourth current Id4 are higher than the first reference current Irefp and both of the first current Id1 and third current Id3 are lower than the second reference current Irefn. Consequently, in the first current-to-voltage converter 350, the first output signal Vop+ is higher than the second output signal Vop−. Moreover, in the second current-to-voltage converter 360, the third output signal Vom+ is lower than the fourth output signal Vom−. Under this circumstance, the signal outputted from the output terminal o1 of the first comparator 371 is in the high logic-level state, and the signal outputted from the output terminal o2 of the second comparator 372 is in the low logic-level state. Consequently, the detected signal Sout outputted from the judging circuit 370 is in the high logic-level state, representing the valid differential input signal.

Figure 4B:
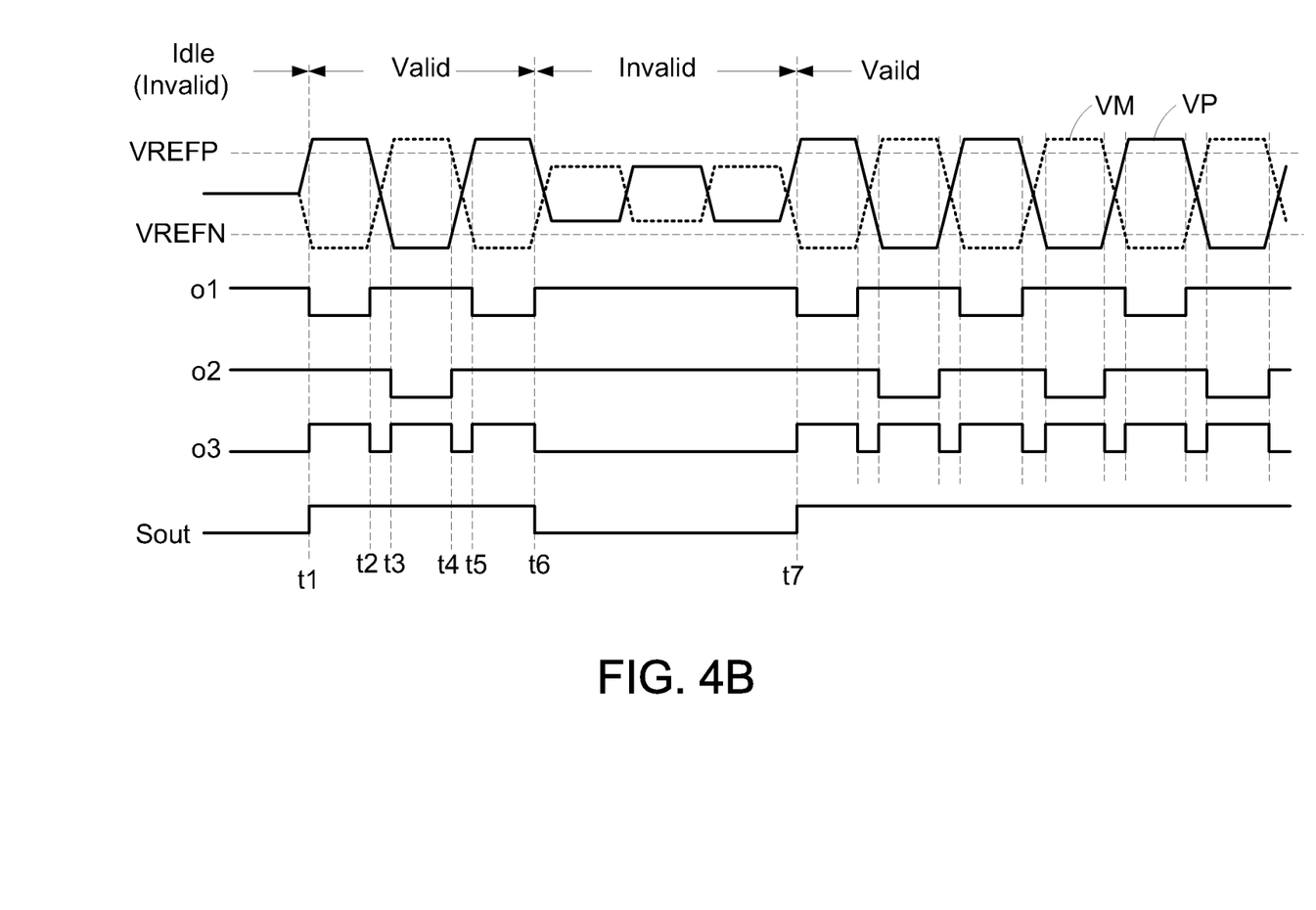
FIG. 4B is a schematic timing waveform diagram illustrating associated signals processed by the squelch detector according to the first embodiment of the present invention.

FIG. 4B is a schematic timing waveform diagram illustrating associated signals processed by the squelch detector according to the first embodiment of the present invention.

Before the time point t1, the differential input signal is in an idle state. Consequently, the differential input signal is maintained at the same voltage. The magnitude of this voltage is in the range between the first reference voltage VREFP and the second reference voltage VREFN. Under this circumstance, the signal outputted from the output terminal o1 of the first comparator 371 is in the high logic-level state, the signal outputted from the output terminal o2 of the second comparator 372 is in the high logic-level state, and the signal outputted from the output terminal o3 of the NAND gate 375 is in the low logic-level state. Consequently, the detected signal Sout is in the low logic-level state, representing the invalid differential input signal.

In the time interval between the time point t1 and the time point t2, the maximum value of the first input signal VP is higher than the first reference voltage VREFP and the minimum value of the second input signal VM is lower than the second reference voltage VREFN. Under this circumstance, the signal outputted from the output terminal o1 of the first comparator 371 is in the low logic-level state, the signal outputted from the output terminal o2 of the second comparator 372 is in the high logic-level state, and the signal outputted from the output terminal o3 of the NAND gate 375 is in the high logic-level state. Consequently, the detected signal Sout is in the high logic-level state, representing the valid differential input signal.

The time interval between the time point t2 and the time point t3 indicates a transition state of the first input signal VP and the second input signal VM. In the transition state, the signal outputted from the output terminal o3 of the NAND gate 375 is temporarily in the low logic-level state. By the deglitch circuit 377, the temporary low logic-level state will not change the level of the detected signal Sout. In other words, the detected signal Sout is still in the high logic-level state, representing the valid differential input signal.

In the time interval between the time point t3 and the time point t4, the maximum value of the second input signal VM is higher than the first reference voltage VREFP and the minimum value of the first input signal VP is lower than the second reference voltage VREFN. Under this circumstance, the signal outputted from the output terminal o1 of the first comparator 371 is in the high logic-level state, the signal outputted from the output terminal o2 of the second comparator 372 is in the low logic-level state, and the signal outputted from the output terminal o3 of the NAND gate 375 is in the high logic-level state. Consequently, the detected signal Sout is in the high logic-level state, representing the valid differential input signal.

The time interval between the time point t4 and the time point t5 indicates the transition state of the first input signal VP and the second input signal VM. Similarly, the detected signal Sout is still in the high logic-level state, representing the valid differential input signal.

In the time interval between the time point t6 and the time point t7, the maximum values of the first input signal VP and the second input signal VM are lower than the first reference voltage VREFP and the minimum values of the first input signal VP and the second input signal VM are higher than the second reference voltage VREFN. Under this circumstance, the signal outputted from the output terminal o1 of the first comparator 371 is in the high logic-level state, the signal outputted from the output terminal o2 of the second comparator 372 is in the high logic-level state, and the signal outputted from the output terminal o3 of the NAND gate 375 is in the low logic-level state. Consequently, the detected signal Sout is in the low logic-level state, representing the invalid differential input signal.

Similarly, after the time point t7, the detected signal Sout is still in the high logic-level state, representing the valid differential input signal. The principles are not redundantly described herein.

Figure 5A:
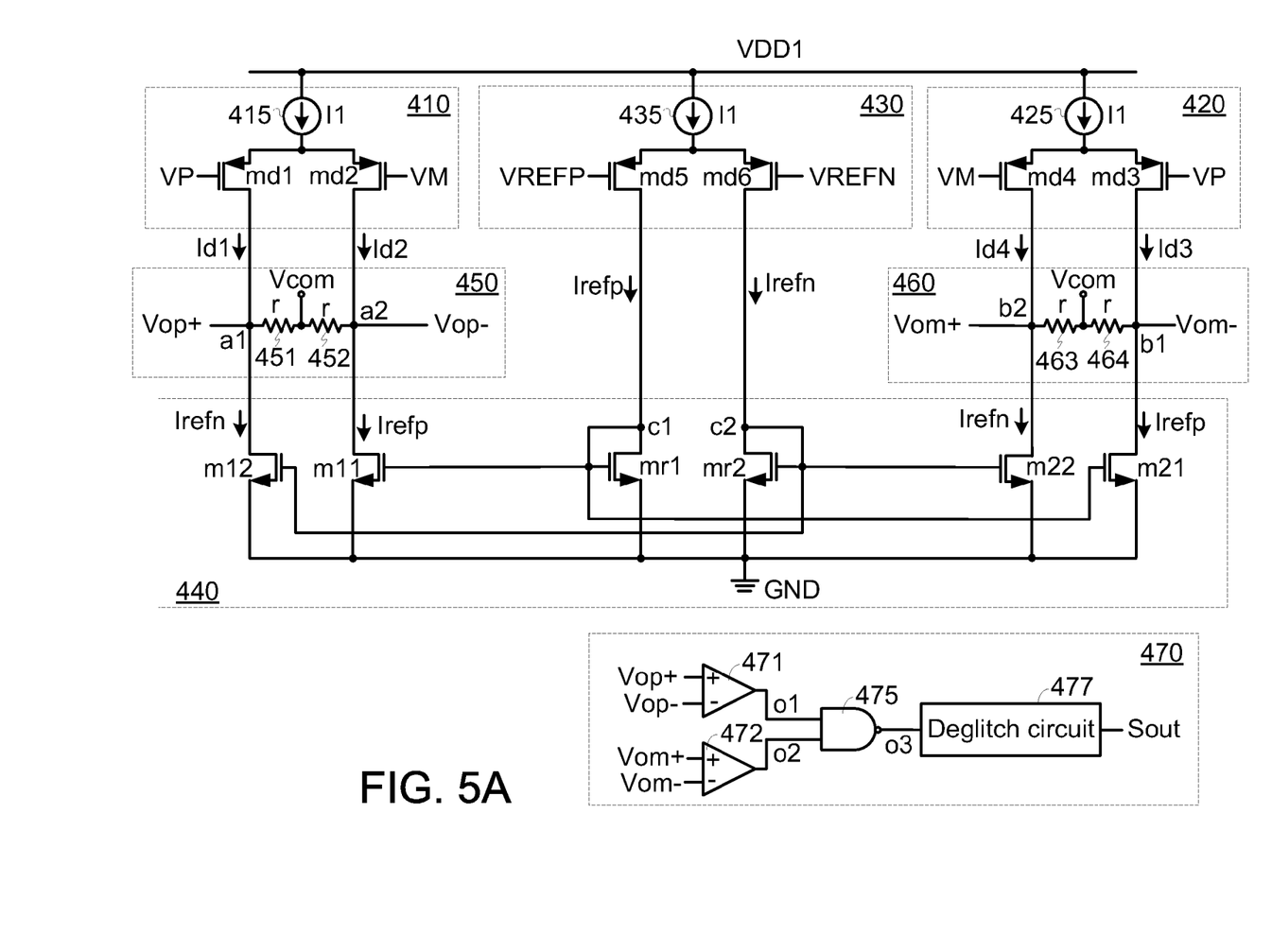
FIG. 5A schematically illustrates the architecture of a squelch detector according to a second embodiment of the present invention.

FIG. 5A schematically illustrates the architecture of a squelch detector according to a second embodiment of the present invention. As shown in FIG. 5A, the squelch detector comprises a first differential pair circuit 410, a second differential pair circuit 420, a reference differential pair circuit 430, a mirroring circuit 440, a first current-to-voltage converter 450, a second current-to-voltage converter 460, and a judging circuit 470.

The first differential pair circuit 410 comprises a first current source 415, and two transistors md1 and md2. A first end of the first current source 415 is connected with a first voltage source VDD1. The source terminal of the transistor md1 is connected with a second end of the first current source 415. The drain terminal of the transistor md1 is connected with a node a1. The gate terminal of the transistor md1 receives the first input signal VP. The source terminal of the transistor md2 is connected with the second end of the first current source 415. The drain terminal of the transistor md2 is connected with a node a2. The gate terminal of the transistor md2 receives the second input signal VM. The first current source 415 may generate a constant current I0. According to the first input signal VP and the second input signal VM, the first differential pair circuit 410 generates a first current Id1 and a second current Id2 from the drain terminal of the transistor md1 and the drain terminal of the transistor md2, respectively.

The second differential pair circuit 420 comprises a second current source 425, and two transistors md3 and md4. A first end of the second current source 425 is connected with the first voltage source VDD1. The source terminal of the transistor md3 is connected with a second end of the second current source 425. The drain terminal of the transistor md3 is connected with a node b1. The gate terminal of the transistor md3 receives the first input signal VP. The source terminal of the transistor md4 is connected with the second end of the second current source 425. The drain terminal of the transistor md4 is connected with a node b2. The gate terminal of the transistor md4 receives the second input signal VM. The second current source 425 may generate the constant current I0. According to the first input signal VP and the second input signal VM, the second differential pair circuit 420 generates a third current Id3 and a fourth current Id4 from the drain terminal of the transistor md3 and the drain terminal of the transistor md4, respectively.

The reference differential pair circuit 430 comprises a third current source 435, and two transistors md5 and md6. A first end of the third current source 435 is connected with the first voltage source VDD1. The source terminal of the transistor md5 is connected with a second end of the third current source 435. The drain terminal of the transistor md5 is connected with a node c1. The gate terminal of the transistor md3 receives the first reference voltage VREFP. The source terminal of the transistor md6 is connected with the second end of the third current source 435. The drain terminal of the transistor md6 is connected with a node c2. The gate terminal of the transistor md6 receives the second reference voltage VREFN. The third current source 435 may generate the constant current I0. According to the first reference voltage VREFP and the second reference voltage VREFN, the reference differential pair circuit 430 generates a first reference current Irefp and a second reference current Irefn from the drain terminal of the transistor md5 and the drain terminal of the transistor md5, respectively.

The mirroring circuit 440 comprises two current mirrors. The first current mirror comprises three transistors mr1, m11 and m21. The drain terminal and the gate terminal of the transistor mr1 are connected with the node c1. The source terminal of the transistor mr1 is connected with a ground voltage source GND. The gate terminal of the transistor mr11 is connected with the node c1. The drain terminal of the transistor mr11 is connected with the node a2. The source terminal of the transistor mr11 is connected with the ground voltage source GND. The gate terminal of the transistor mr21 is connected with the node c1. The drain terminal of the transistor mr21 is connected with the node b1. The source terminal of the transistor mr21 is connected with the ground voltage source GND. Moreover, the drain terminal of the transistor mr1 is a current input terminal of the first current mirror, the drain terminal of the transistor mr11 is a first current mirroring terminal of the first current mirror, and the drain terminal of the transistor mr21 is a second current mirroring terminal of the first current mirror. In other word, the first reference current Irefp is received by the current input terminal of the first current mirror, and the first reference current Irefp is outputted from the two current mirroring terminals.

The second current mirror comprises three transistors mr2, m12 and m22. The drain terminal and the gate terminal of the transistor mr2 are connected with the node c2. The source terminal of the transistor mr2 is connected with the ground voltage source GND. The gate terminal of the transistor mr12 is connected with the node c2. The drain terminal of the transistor mr12 is connected with the node a1. The source terminal of the transistor mr12 is connected with the ground voltage source GND. The gate terminal of the transistor mr22 is connected with the node c2. The drain terminal of the transistor mr22 is connected with the node b2. The source terminal of the transistor mr22 is connected with the ground voltage source GND. Moreover, the drain terminal of the transistor mr2 is a current input terminal of the second current mirror, the drain terminal of the transistor mr12 is a first current mirroring terminal of the second current mirror, and the drain terminal of the transistor mr22 is a second current mirroring terminal of the second current mirror. In other word, the second reference current Irefn is received by the current input terminal of the second current mirror, and the second reference current Irefn is outputted from the two current mirroring terminals of the second current mirror.

The first current-to-voltage converter 450 is connected with the node a1 and the node a2. According to the current changes of the node a1 and the node a2, the first current-to-voltage converter 450 generates a first output signal Vop+ and a second output signal Vop−. The first current-to-voltage converter 450 comprises a first resistor 451 and a second resistor 452. A first end of the first resistor 451 is connected with the node a1. A second end of the first resistor 451 receives a common mode voltage Vcm. A first end of the second resistor 452 is connected with the node a2. A second end of the second resistor 452 receives the common mode voltage Vcm. By subtracting the second output signal Vop− from the first output signal Vop+, a first differential output signal Vop is generated. That is, (Vop+)−(Vop−)=Vop. In this embodiment, the first resistor 451 and the second resistor 452 have the same resistance value r.

The second current-to-voltage converter 460 is connected with the node b1 and the node b2. According to the current changes of the node b1 and the node b2, the second current-to-voltage converter 460 generates a third output signal Vom+ and a fourth output signal Vom−. The second current-to-voltage converter 460 comprises a third resistor 463 and a fourth resistor 464. A first end of the third resistor 463 is connected with the node b2. A second end of the third resistor 463 receives the common mode voltage Vcm. A first end of the fourth resistor 464 is connected with the node b1. A second end of the fourth resistor 464 receives the common mode voltage Vcm. By subtracting the fourth output signal Vom− from the third output signal Vom+, a second differential output signal Vom is generated. That is, (Vom+)−(Vom−)=Vom. In this embodiment, the third resistor 463 and the fourth resistor 464 have the same resistance value r.

Moreover, the judging circuit 470 receives the first output signal Vop+, the second output signal Vop−, the third output signal Vom+ and the fourth output signal Vom−, and generates a detected signal Sout according to the detecting result. The detected signal Sout indicates whether the differential input signal is valid or not. In this embodiment, the judging circuit 470 comprises a first comparator 471, a second comparator 472, an NAND gate 475, and a deglitch circuit 477. The first comparator 471 comprises a positive input terminal receiving the first output signal Vop+ and a negative input terminal receiving the second output signal Vop−. The second comparator 472 comprises a positive input terminal receiving the third output signal Vom+ and a negative input terminal receiving the fourth output signal Vom−. The two input terminals of the NAND gate 475 are connected with the output terminal o1 of the first comparator 471 and the output terminal o2 of the second comparator 472. The deglitch circuit 477 is connected with the output terminal o3 of the NAND gate 475. In addition, the detected signal Sout is outputted from the deglitch circuit 477.

Similarly, if the first differential output signal Vop and the second differential output signal Vom have the same polarity, the detected signal Sout is in a first logic-level state (e.g. a low logic-level state). The detected signal Sout in the first logic-level state represents the invalid differential input signal. Whereas, if the first differential output signal Vop and the second differential output signal Vom have opposite polarities, the detected signal Sout is in a second logic-level state (e.g. a high logic-level state). The detected signal Sout in the second logic-level state represents the valid differential input signal. The reasons will be illustrated in more details as follows.

Since the first reference voltage VREFP is higher than the second reference voltage VREFN, the first reference current Irefp is higher than the second reference current Irefn.

If the maximum values of the first input signal VP and the second input signal VM are lower than the first reference voltage VREFP and the minimum values of the first input signal VP and the second input signal VM are higher than the second reference voltage VREFN, both of the first current Id1 and third current Id3 are lower than the first reference current Irefp and both of the second current Id2 and the fourth current Id4 are higher than the second reference current Irefn. Consequently, in the first current-to-voltage converter 450, the first output signal Vop+ is higher than the second output signal Vop−. Moreover, in the second current-to-voltage converter 460, the third output signal Vom+ is higher than the fourth output signal Vom−. Under this circumstance, the signal outputted from the output terminal o1 of the first comparator 471 and the signal outputted from the output terminal o2 of the second comparator 472 are both in the high logic-level state. Consequently, the detected signal Sout outputted from the judging circuit 470 is in the low logic-level state, representing the invalid differential input signal.

On the other hand, if the maximum value of the first input signal VP is higher than the first reference voltage VREFP and the minimum value of the second input signal VM is lower than the second reference voltage VREFN, both of the first current Id1 and third current Id3 are higher than the first reference current Irefp and both of the second current Id2 and the fourth current Id4 are lower than the second reference current Irefn. Consequently, in the first current-to-voltage converter 450, the first output signal Vop+ is higher than the second output signal Vop−. Moreover, in the second current-to-voltage converter 460, the third output signal Vom+ is lower than the fourth output signal Vom−. Under this circumstance, the signal outputted from the output terminal o1 of the first comparator 471 is in the high logic-level state, and the signal outputted from the output terminal o2 of the second comparator 472 is in the low logic-level state. Consequently, the detected signal Sout outputted from the judging circuit 470 is in the high logic-level state, representing the valid differential input signal.

On the other hand, if the maximum value of the second input signal VM is higher than the first reference voltage VREFP and the minimum value of the first input signal VP is lower than the second reference voltage VREFN, both of the second current Id2 and the fourth current Id4 are higher than the first reference current Irefp and both of the first current Id1 and third current Id3 are lower than the second reference current Irefn. Consequently, in the first current-to-voltage converter 450, the first output signal Vop+ is lower than the second output signal Vop−. Moreover, in the second current-to-voltage converter 460, the third output signal Vom+ is higher than the fourth output signal Vom−. Under this circumstance, the signal outputted from the output terminal o1 of the first comparator 471 is in the low logic-level state, and the signal outputted from the output terminal o2 of the second comparator 472 is in the high logic-level state. Consequently, the detected signal Sout outputted from the judging circuit 470 is in the high logic-level state, representing the valid differential input signal.

Figure 5B:
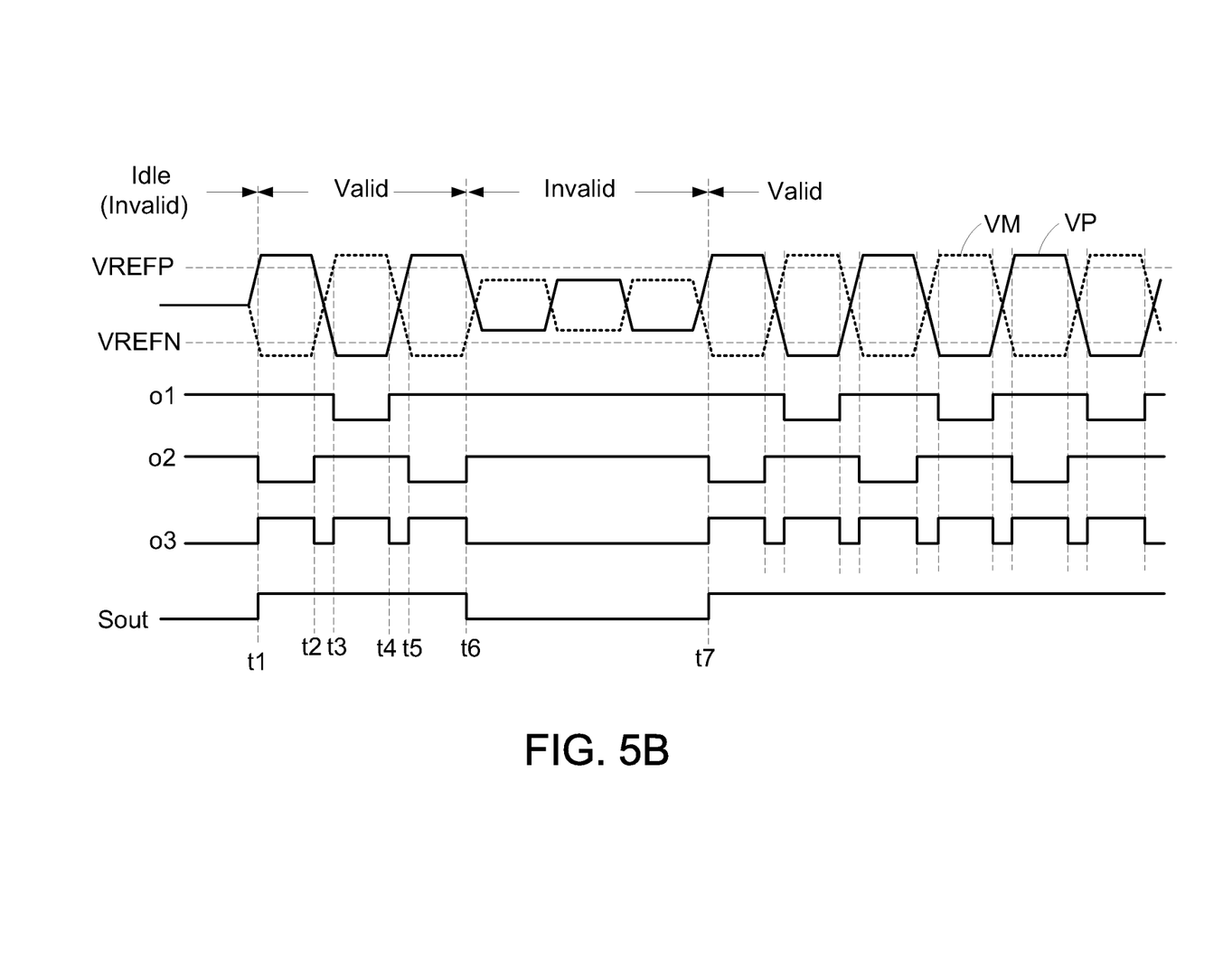
FIG. 5B is a schematic timing waveform diagram illustrating associated signals processed by the squelch detector according to the second embodiment of the present invention.

FIG. 5B is a schematic timing waveform diagram illustrating associated signals processed by the squelch detector according to the second embodiment of the present invention.

Before the time point t1, the differential input signal is in an idle state. Consequently, the differential input signal is maintained at the same voltage. The magnitude of this voltage is in the range between the first reference voltage VREFP and the second reference voltage VREFN. Under this circumstance, the signal outputted from the output terminal o1 of the first comparator 471 is in the high logic-level state, the signal outputted from the output terminal o2 of the second comparator 472 is in the high logic-level state, and the signal outputted from the output terminal o3 of the NAND gate 475 is in the low logic-level state. Consequently, the detected signal Sout is in the low logic-level state, representing the invalid differential input signal.

In the time interval between the time point t1 and the time point t2, the maximum value of the first input signal VP is higher than the first reference voltage VREFP and the minimum value of the second input signal VM is lower than the second reference voltage VREFN. Under this circumstance, the signal outputted from the output terminal o1 of the first comparator 471 is in the high logic-level state, the signal outputted from the output terminal o2 of the second comparator 472 is in the low logic-level state, and the signal outputted from the output terminal o3 of the NAND gate 475 is in the high logic-level state. Consequently, the detected signal Sout is in the high logic-level state, representing the valid differential input signal.

The time interval between the time point t2 and the time point t3 indicates a transition state of the first input signal VP and the second input signal VM. In the transition state, the signal outputted from the output terminal o3 of the NAND gate 475 is temporarily in the low logic-level state. By the deglitch circuit 477, the temporary low logic-level state will not change the level of the detected signal Sout. In other words, the detected signal Sout is still in the high logic-level state, representing the valid differential input signal.

In the time interval between the time point t3 and the time point t4, the maximum value of the second input signal VM is higher than the first reference voltage VREFP and the minimum value of the first input signal VP is lower than the second reference voltage VREFN. Under this circumstance, the signal outputted from the output terminal o1 of the first comparator 471 is in the low logic-level state, the signal outputted from the output terminal o2 of the second comparator 472 is in the high logic-level state, and the signal outputted from the output terminal o3 of the NAND gate 475 is in the high logic-level state. Consequently, the detected signal Sout is in the high logic-level state, representing the valid differential input signal.

The time interval between the time point t4 and the time point t5 indicates the transition state of the first input signal VP and the second input signal VM. Similarly, the detected signal Sout is still in the high logic-level state, representing the valid differential input signal.

In the time interval between the time point t6 and the time point t7, the maximum values of the first input signal VP and the second input signal VM are lower than the first reference voltage VREFP and the minimum values of the first input signal VP and the second input signal VM are higher than the second reference voltage VREFN. Under this circumstance, the signal outputted from the output terminal o1 of the first comparator 471 is in the high logic-level state, the signal outputted from the output terminal o2 of the second comparator 472 is in the high logic-level state, and the signal outputted from the output terminal o3 of the NAND gate 475 is in the low logic-level state. Consequently, the detected signal Sout is in the low logic-level state, representing the invalid differential input signal.

Similarly, after the time point t7, the detected signal Sout is still in the high logic-level state, representing the valid differential input signal. The principles are not redundantly described herein.

From the above descriptions, the squelch detector of the present invention receives the first input signal VP, the second input signal VM, the first reference voltage VREFP and the second reference voltage VREFN. Moreover, the squelch detector generates a detected signal Sout to indicate whether the differential input signal is valid or not. It is noted that the circuitry configurations of the judging circuit are not restricted. That is, other logic circuits may be combined as the judging circuit.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A squelch detector, comprising:
   a first differential pair circuit receiving a first input signal and a second input signal, and generating a first current and a second current to a first node and a second node, respectively;
   a second differential pair circuit receiving the first input signal and the second input signal, and generating a third current and a fourth current to a third node and a fourth node, respectively;
   a reference differential pair circuit receiving a first reference voltage and a second reference voltage, and generating a first reference current and a second reference current to a fifth node and a sixth node, respectively;
   a first current mirror, wherein a current input terminal of the first current mirror is connected with the fifth node for receiving the first reference current, a first current mirroring terminal of the first current mirror is connected with the first node, and a second current mirroring terminal of the first current mirror is connected with the fourth node;
   a second current mirror, wherein a current input terminal of the second current mirror is connected with the sixth node for receiving the second reference current, a first current mirroring terminal of the second current mirror is connected with the second node, and a second current mirroring terminal of the second current mirror is connected with the third node;
   a first current-to-voltage converter connected with the first node and the second node, and generating a first output signal and a second output signal according to a current change of the first node and the second node;
   a second current-to-voltage converter connected with the third node and the fourth node, and generating a third output signal and a fourth output signal according to a current change of the third node and the third node; and
   a judging circuit receiving the first output signal, the second output signal, the third output signal and the fourth output signal, and generating a detected signal to indicate whether the first input signal and the second input signal are valid.

2. The squelch detector as claimed in claim 1, wherein the first differential pair circuit comprises:
   a first current source having a first end connected with a first voltage source;
   a first transistor, wherein a source terminal of the first transistor is connected with a second end of the first current source, a drain terminal of the first transistor is connected with the first node, and a gate terminal of the first transistor receives the first input signal; and
   a second transistor, wherein a source terminal of the second transistor is connected with the second end of the first current source, a drain terminal of the second transistor is connected with the second node, and a gate terminal of the second transistor receives the second input signal,
   wherein the first current is outputted from the drain terminal of the first transistor, and the second current is outputted from the drain terminal of the second transistor.

3. The squelch detector as claimed in claim 1, wherein the second differential pair circuit comprises:

a second current source having a first end connected with a first voltage source;

a third transistor, wherein a source terminal of the third transistor is connected with a second end of the second current source, a drain terminal of the third transistor is connected with the third node, and a gate terminal of the first transistor receives the first input signal; and a fourth transistor, wherein a source terminal of the fourth transistor is connected with the second end of the second current source, a drain terminal of the fourth transistor is connected with the fourth node, and a gate terminal of the fourth transistor receives the second input signal, wherein the third current is outputted from the drain terminal of the third transistor, and the fourth current is outputted from the drain terminal of the fourth transistor.

4. The squelch detector as claimed in claim 1, wherein the reference differential pair circuit comprises:

a third current source having a first end connected with a first voltage source;

a fifth transistor, wherein a source terminal of the fifth transistor is connected with a second end of the third current source, a drain terminal of the fifth transistor is connected with the fifth node, and a gate terminal of the fifth transistor receives the first reference voltage; and a sixth transistor, wherein a source terminal of the sixth transistor is connected with the second end of the third current source, a drain terminal of the sixth transistor is connected with the sixth node, and a gate terminal of the sixth transistor receives the second reference voltage, wherein the first reference current is outputted from the drain terminal of the fifth transistor, and the second reference current is outputted from the drain terminal of the sixth transistor.

5. The squelch detector as claimed in claim 1, wherein the first current mirror comprises:

a seventh transistor, wherein a drain terminal and a gate terminal of the seventh transistor are connected with the fifth node, a source terminal of the seventh transistor is connected with a ground voltage source;

an eighth transistor, wherein a gate terminal of the eighth transistor is connected with the fifth node, a drain terminal of the eighth transistor is connected with the first node, and a source terminal of the eighth transistor is connected with the ground voltage source; and a ninth transistor, wherein a gate terminal of the ninth transistor is connected with the fifth node, a drain terminal of the ninth transistor is connected with the fourth node, and a source terminal of the ninth transistor is connected with the ground voltage source.

6. The squelch detector as claimed in claim 1, wherein the second current mirror comprises:

a tenth transistor, wherein a drain terminal and a gate terminal of the tenth transistor are connected with the sixth node, a source terminal of the tenth transistor is connected with a ground voltage source;

an eleventh transistor, wherein a gate terminal of the eleventh transistor is connected with the sixth node, a drain terminal of the eleventh transistor is connected with the second node, and a source terminal of the eleventh transistor is connected with the ground voltage source; and a twelfth transistor, wherein a gate terminal of the twelfth transistor is connected with the sixth node, a drain terminal of the twelfth transistor is connected with the third node, and a source terminal of the twelfth transistor is connected with the ground voltage source.

7. The squelch detector as claimed in claim 1, wherein the first current-to-voltage converter comprises:

a first resistor, wherein a first end of the first resistor is connected with a second voltage source, and the first output signal is outputted from a second end of the first resistor;

a second resistor, wherein a first end of the second resistor is connected with the second voltage source, and the second output signal is outputted from a second end of the second resistor;

a thirteenth transistor, wherein a gate terminal of the thirteenth transistor receives a bias voltage, a drain terminal of the thirteenth transistor is connected with the second end of the first resistor, and a source terminal of the thirteenth transistor is connected with the second node; and a fourteenth transistor, wherein a gate terminal of the fourteenth transistor receives the bias voltage, a drain terminal of the fourteenth transistor is connected with the second end of the second resistor, and a source terminal of the fourteenth transistor is connected with the first node.

8. The squelch detector as claimed in claim 7, wherein the second current-to-voltage converter comprises:

a third resistor, wherein a first end of the third resistor is connected with the second voltage source, and the third output signal is outputted from a second end of the third resistor;

a fourth resistor, wherein a first end of the second resistor is connected with the second voltage source, and the fourth output signal is outputted from a second end of the fourth resistor;

a fifteenth transistor, wherein a gate terminal of the fifteenth transistor receives a bias voltage, a drain terminal of the fifteenth transistor is connected with the second end of the third resistor, and a source terminal of the fifteenth transistor is connected with the third node; and a sixteenth transistor, wherein a gate terminal of the sixteenth transistor receives the bias voltage, a drain terminal of the sixteenth transistor is connected with the second end of the fourth resistor, and a source terminal of the sixteenth transistor is connected with the fourth node.

9. The squelch detector as claimed in claim 1, wherein the first current-to-voltage converter comprises:

a first resistor, wherein a first end of the first resistor is connected with the first node, and a second end of the first resistor receives a common mode voltage; and a second resistor, wherein a first end of the second resistor is connected with the second node, and a second end of the second resistor receives the common mode voltage.

10. The squelch detector as claimed in claim 9, wherein the second current-to-voltage converter comprises:

a third resistor, wherein a first end of the third resistor is connected with the third node, and a second end of the first resistor receives the common mode voltage; and a fourth resistor, wherein a first end of the fourth resistor is connected with the fourth node, and a second end of the fourth resistor receives the common mode voltage.

11. The squelch detector as claimed in claim 1, wherein the judging circuit comprises:

a first comparator receiving the first output signal and the second output signal;

a second comparator receiving the third output signal and the fourth output signal;

a NAND gate, wherein a first input terminal of the NAND gate is connected with an output terminal of the first comparator, and a second input terminal of the NAND gate is connected with an output terminal of the second comparator; and a deglitch circuit connected with an output terminal of the NAND gate, wherein the detected signal is outputted from the deglitch circuit.

* * * * *